United States Patent [19]

Davis et al.

[11] 3,771,028

[45] Nov. 6, 1973

[54] HIGH GAIN, LOW SATURATION TRANSISTOR

[75] Inventors: John R. Davis, Export; Surinder Krishna, Greensburg, both of Pa.

[73] Assignee: Westinghouse Electric Corporation, Pittsburgh, Pa.

[22] Filed: May 26, 1972

[21] Appl. No.: 257,088

[52] U.S. Cl. ..... 317/235 R, 317/234 S, 317/235 AJ

[51] Int. Cl. .......... H01l 5/00

[58] Field of Search .......... 317/235, 234

[56] References Cited

UNITED STATES PATENTS

| | | | |
|---|---|---|---|
| 3,186,879 | 6/1965 | Schnable | 148/1.5 |
| 3,322,581 | 5/1967 | Hendrickson et al. | 148/175 |
| 3,088,888 | 5/1963 | Leff | 204/143 |

*Primary Examiner*—John S. Heyman
*Assistant Examiner*—E. Wojciechowicz
*Attorney*—F. Shapoe et al.

[57] ABSTRACT

A high current transistor with high gain and low power loss is provided in a semiconductor body having a membranous internal portion of substantially uniform thickness of less than about 60 microns and of oppositely facing surfaces each of greater than about 0.10 $cm^2$ in area, and a thick peripheral portion of greater than about 150 microns. Thus a narrow base region of less than about 52 microns and preferably less than about 20 microns in width having a substantially uniform, precisely dimensioned thickness is provided at the internal portion of the body between shallow, highly doped, preferably conjugate emitter and collector regions. Ohmic contacts are made to the collector and emitter regions at the opposite surfaces of the internal portion, and ohmic contact is made to the base region at the peripheral portion of the semiconductor body.

Preferably the transistor is made by a method involving deep etching of the semiconductor body after electroplating an etchant resistant coating onto selected surface portions of the body.

7 Claims, 11 Drawing Figures

HIGH GAIN, LOW SATURATION TRANSISTOR

FIELD OF THE INVENTION

The present invention relates to semiconductor devices and specifically transistors.

BACKGROUND OF THE INVENTION

Junction transistors are old and well known in the art. They have emitter and collector regions formed by one conductive type of impurity, and a base region formed by the opposite conductive type of impurity. The emitter and collector regions adjoin opposite major surfaces of a semiconductor body and the base region is partially in the interior portion of the semiconductor body between the emitter and collector regions. Thus, two PN junctions are formed, one by the transition from the emitter to base regions and one by the transition from the collector to base regions.

The current capacity and power losses of a junction transistor are dependent on the planar size of its PN junctions, its saturation currents, its saturation voltage and its current gain. The planar size of the PN junctions have been optimized within the limits of acceptable transistor geometry. Saturation current has been lowered to negligible levels by making the impurity concentration profiles of the emitter and collector regions conjugate, i.e. the profiles are essentially symmetrical or mirror images, by simultaneously diffusing an impurity through the oppositely facing major surfaces of a semiconductor body which has a given impurity level of the opposite conductive type therethrough. The saturation currents $I_{CS}$ and $I_{ES}$ are thereby made equal so that the component of the collector to emitter saturation voltage attributable to saturation current across the junctions is nearly equal to zero.

Thus, the current capacity and power losses in a transistor are primarily dependent on the component of saturation voltage attributable to bulk resistance and to the gain. The lower the bulk resistance, the lower the saturation voltage and in turn the higher the current capacity and the lower the power losses. Bulk resistance is dependent on the impurity concentrations (resistivities) and widths of the various transistor regions and most notably the region of lowest doping; therefore it can be minimized by increasing the conductivity (i.e. lowering the resistivity) of the emitter and collector regions. However, handling requirements during transistor manufacture dictate that the semiconductor body be greater than about 150 and preferbly 200 microns in thickness. Long and hard to control diffusions are therefore necessary to decrease the saturation voltage of the transistor. Hence, the manufacturing time is lengthy and the number of rejects of such devices during manufacture is high.

The problem is compounded where high gain is desired to maximize current capacity and minimize power losses. Gain is primarily a function of the injection efficiency, minority carrier lifetime and the base width. In general, for highest gain the base region should have the least width and the highest impurity concentration consistent with operating voltage requirements; a higher operating voltage necessitates a lower impurity concentration and increased width of the base region. The requirement for a body thickness of greater than 150 microns therefore greatly restricts the achievable gains of transistors made by symetrical diffusion techniques. The deeper the diffusion to narrow the base width, the lower the impurity concentrations in the emitter region adjoining the PN junction with the base. Moreover, requisite control of the diffusion must be much more precise. Quality control is therefore much more stringent and even more rejects of the transistors result from the deep and hard to control diffusions.

It has been proposed to decrease the width of the base region for various reasons by etching away opposite internal portions of the major surfaces of the semiconductor body before diffusing in the emitter and collector regions. Two such proposals are shown in U.S. Pat. Nos. 2,885,571 and 2,921,362. But relatively thick and/or bowl-shaped internal portions result. The mask techniques permit only shallow etches; the available etchant resists peel or break down after a short period of exposure to an etchant causing the masked portion of the semiconductor body to be attacked. Deep etches can be attained by the jet-etch technique, see U.S. Pat. No. 2,885,571. But bowl-shaped and irregular internal portions rather than internal portions of substantially uniform thickness and relatively large surface area are necessarily formed. A thick semiconductor body with membranous internal portions of substantially large areas (i.e. greater than about 0.10 $cm^2$) and narrow substantially uniform thickness (i.e. less than about 60 microns) could not be made.

The present invention overcomes these difficulties. It provides a high current transistor that has high gain and low power losses.

SUMMARY OF THE INVENTION

A high current transistor with high gain and low power losses is provided in a semiconductor body of greater than about 150 microns in thickness that has a pair of oppositely facing major surfaces and side surfaces. The body has a preselected impurity concentration therethrough corrresponding to a desired resistivity of preferably less than 10 ohm-cms. The semiconductor body has a membranous internal portion of substantially uniform thickness of less than about 60 microns and preferably less than about 20 microns and of oppositely facing surfaces each of greater than about 0.10 $cm^2$ in area, and an integral peripheral portion of thickness corresponding to the thickness of the semiconductor body. An abrupt transition is hence made between the membranous internal portion and the peripheral portion.

Collector and emitter regions, preferably of substantially conjugate concentration profiles, are diffused into opposite major surfaces of the membranous internal region. The collector and emitter regions are preferably confined to the membranous internal portion but may extend into the peripheral portion to a limited degree for convenience in manufacture as is more fully described hereinafter. However, the surface areas adjoining both the collector and emitter region should be as large as the internal portion will permit to provide maximum current capacity to the transistor. The diffusion of the collector and emitter regions results in a narrow base region therebetween of less than about 52 microns of substantially uniform, precisely dimensioned thickness.

Preferably, the transistor is made by commencing with a semiconductor body of greater than about 150 microns in thickness having oppositely facing major surfaces and having a given level of impurity concentration therethrough. At least one major surface has vapor deposited thereon, e.g. by evaporation or sputtering, a metal capable of adhering to the semiconductor body or to a bonding layer previously vapor deposited on said surface to form an adherent vapor deposited metal layer over the major surface. Thereafter selected portions of the vapor deposited metal layer, as well as any bonding layer, corresponding to the internal portion of the body can be removed, e.g. by etching, to expose the internal areas of said major surface; an etchant resistant layer is then electroplated to the remaining vapor deposited layer. Subsequently, after masking any other exposed surfaces said internal areas are etched to form in the semiconductor body a membranous internal portion of substantially uniform thickness of less than about 60 microns and having oppositely facing surfaces each of greater than about 0.10 $cm^2$, and an integral peripheral portion of thickness corresponding to the thickness of the semiconductor body.

Thereafter, the collector and emitter regions are simultaneously formed by selectively masking the surfaces adjoining the peripheral portion of the semiconductor body; and diffusing an impurity of the opposite conductive type from the impurities forming the given level of impurity concentration through the semiconductor body into the opposite surfaces of the internal portion. The diffusion is shallow and highly concentrated (i.e. $1 \times 10^{19}$ to $1 \times 10^{21}$ atoms/$cm^3$) so that the depth of the collector, emitter, and base regions at the internal portion of the semiconductor body are precisely determined.

The resulting transistor has its electrical operation effectively restricted to the internal portion of the semiconductor body. Since the width of the base region at the internal portion can be precisely controlled, said width can be selected so that the electrical characteristics of the transistor are optimized. The depth need only be large enough to support the carrier depletion region (situated primarily in the base region) necessary to sustain the design voltage capacity without breakdown or punch-through. The collector and emitter regions have high impurity concentrations and a steep impurity concentration gradient so that resistivity is low and injection efficiency is high. Thus, the current capacity and the gain, as well as the high frequency capacity and switching speed, can be optimized for the design voltage capacity. Moreover, the precise control of the width of the base region permits the impurity concentrations in the base region to be increased and still maintain a safe operating range. The increase in impurity concentration in turn permits the current gain and current capacity to be even further extended. The thick peripheral portion of the semiconductor body provides the handling requirements for manufacture of the transistor; it is of negligible value in providing the electrical characteristics of the transistor.

Other details, objections and advantages of the invention will become apparent as the following description of a present preferred embodiment and a present preferred method of practicing the same proceeds.

BRIEF DESCRIPTION OF THE DRAWINGS

In the accompanying drawings, the present preferred embodiment of the invention and the present preferred method of practicing the invention is illustrated in which:

FIG. 8 is a cross-sectional view of an NPN transistor taken along line VIII—VIII of FIG. 9;

DESCRIPTION OF THE PREFERRED EMBODIMENTS

Figure 1:
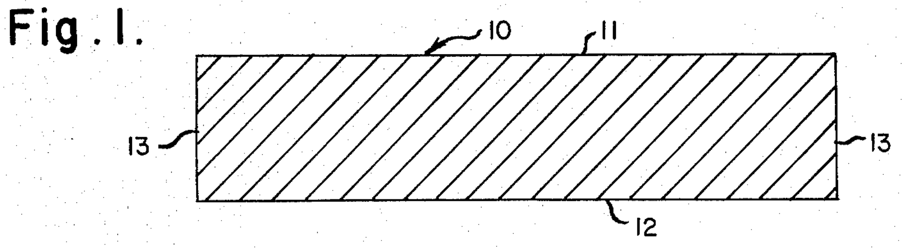
FIGS. 1–8 are cross-sectional views in elevation through the center of an NPN transistor at various stages of manufacture.

Referring to FIG. 1, cylindrical silicon semiconductor body 10 of greater than about 150 microns in thickness (e.g. 200 microns) has a pair of oppositely facing major surfaces 11 and 12, and curvilinear side surfaces 13. Semiconductor body 10 has a preselected P-type impurity concentration throughout, preferably providing a resistivity of 10 ohm-cms or less. The impurity concentration is preferably provided during epitaxial growth of semiconductor body 10.

Figure 2:
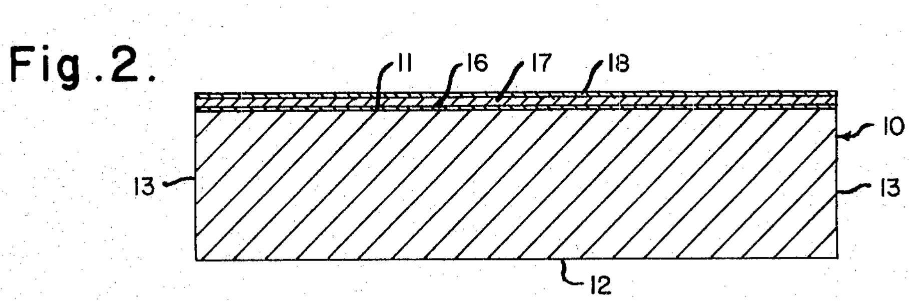

Referring to FIG. 2, bonding layer 16 of a metal having strong bonding properties to silicon and to other metals, such as anodic metals, is formed over major surface 11. Suitable metals for this purpose are titanium, chromium, aluminum, zirconium, molybdenum, vanadium, columbium, tantalum and tungsten. Preferably bonding layer 16 is formed by depositing the metal by evaporation by procedures well known in the art to a thickness typically of about 500 Angstroms.

Vapor deposited metal layer 17 of a metal is subsequently formed over bonding layer 16 to form an adherent metal layer over major surface 11. Preferably the metal selected should be resistant to various etchants that will etch the body 10 as well as be readily electroplatable. Suitable metals for the vapor deposited layer are the Group IB, VIA and VIII metals, and particularly gold, platinum, nickel, palladium, and tungsten. Preferably layer 17 is formed by depositing the metal by evaporation by procedures well known in the art to a thickness typically of about 2,000 Angstroms.

Thereafter a photomask layer 18 of a type well known in the art is placed over the metal layer 17.

Figure 3:
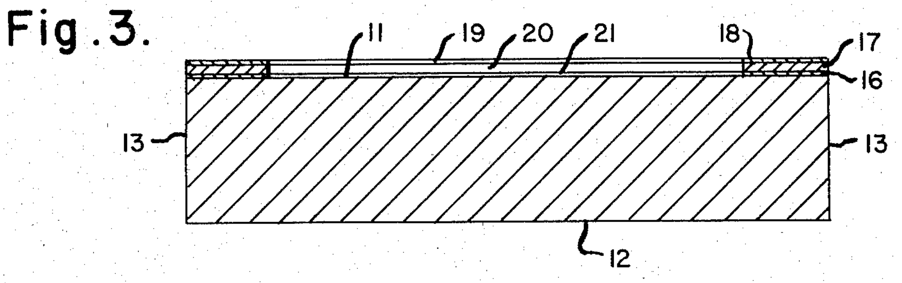

Referring to FIG. 3, corresponding windows 19, 20 and 21 are provided in layers 18, 17 and 16 respectively to expose selected internal areas of major surface 11. Window 19 is formed in photomask layer 18 by method well known in the art, e.g. masking the selected internal portions; exposing the remaining peripheral portions to light to make these portions water-insoluble; and washing away the unmasked water-soluble portions to leave window 19 in photomask layer 18.

Window 20 is then formed by etching through vapor desposited metal layer 17 with a suitable etchant to which photomask layer 18 is resistant. Such etchants vary with the specific metal selected to form layer 17 and are well known to those skilled in the art. For example, a widely used recipe to etch gold is an aqueous solution having 3 parts hydrochloric acid, 1 part nitric acid, and 4 parts water.

Thereafter, window 21 is formed in bonding layer 16 by etching through layer 16 with a suitable etchant without attacking the body 10 and other layers. Such etchants also vary with the metal selected to form layer 16, and are widely known and used in the art. For example, a recipe used to etch titanium is a buffered aqueous solution having 1 part ammonium fluoride, 2 parts hydrochloric acid and 5 parts water.

Figure 4:
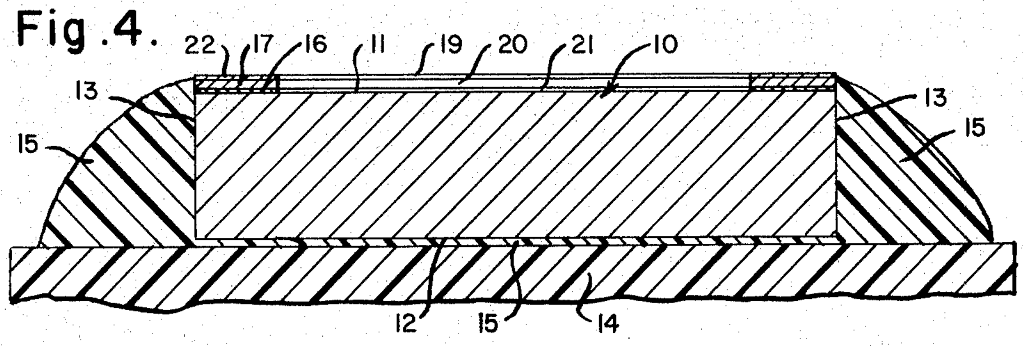

Referring to FIG. 4, photomask layer 18 is removed and etchant resistant metal layer 22 is electroplated over layer 17 by well known methods typically to a thickness from 500 to 10,000 Angstroms. Etchant resistant layer 22 may be formed by the same metal used to form layer 17. The elctroplating closes pin holes formed in the layer 17 during the preceding etching steps and forms a continuous etchant resistant coating for the subsequent deep etching step.

Thereafter, the remaining exposed surfaces 12 and 13 are masked. A low solid wax such as Apiezon$^{TM}$, paraffin or a dental wax is spread over a substrate 14 (e.g. ⅛ to ¼ inch in thickness) of polytetrafloroethylene, stainless steel coated with gold, or glass. The prepared semiconductor body 10 is then embedded in the wax and the wax solidified to form protective coating 15 over surfaces 12 and 13.

Figure 5:
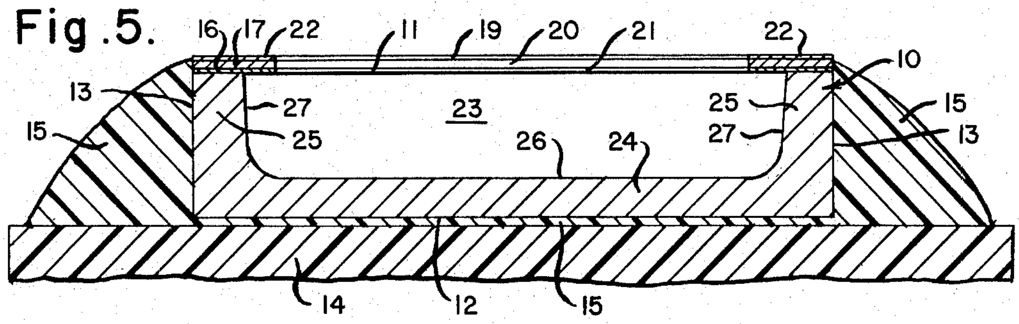

Referring to FIG. 5, well 23 is etched in semiconductor body 10 to provide body 10 with membranous internal portion 24 and a thick peripheral portion 25. Body 10 is immersed in an etchant suitable for etching body 10 and resistant to layer 22, and continuously agitated under carefully adjusted conditions to provide well 23 with a substantially flat foundation surface 26 that is substantially parallel to major surface 12. The composition of the etchant will vary with the composition of body 10 and coating 22. A suitable etchant for etching silicon semiconductor bodies coated with gold is an acid solution having 3 parts hydrofluoric acid, 5 parts acetic acid and 15 parts nitric acid. The adjustment and conditions for obtaining flat foundation surface 26 are well known in the art, e.g. turning the container and solution in which body 10 is immersed on an obliquely positioned turntable at a few revolutions per minute.

By precisely controling the etching conditions (i.e. the concentration of the etchant, length of etching and agitation rate) the dimensions of well 23 and in turn internal portion 24 can be precisely controlled. Internal portion 24 has a substantially uniform thickness of less than about 60 microns and preferably less than about 20 microns (e.g. 10 microns) and oppositely facing surfaces each of greater than 0.10 cm$^2$ in area. Peripheral portion 25 is the thickness of the original semiconductor body 10, i.e. greater than about 150 microns, so that there is an abrupt transition from internal portion 24 to peripheral portion 25 at the transition from foundation surface 26 to curvilinear sidewalls 27, which approach parallelity with side surfaces 13.

Figure 6:
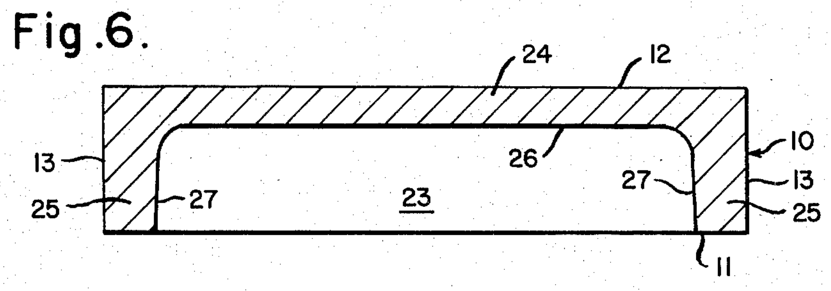

Referring to FIG. 6, metal layers 16, 17 and 22, protective coating 15 and substrate 14 are removed. Layers 16, 17 and 22 are removed by a repetition of the etching steps above described in forming windows 20 and 21. Protective coating 15 and substrate 14 are removed by liquifying the wax composition. The procedures also include cleaning, e.g. by etching, of major surface 12 to provide uniform, uncontaminated major surfaces on the semiconductor body 10.

Figure 7:
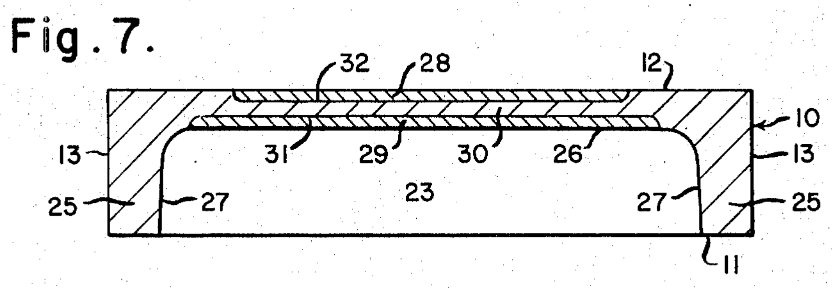

Referring to FIG. 7, shallow emitter region 28 and collector region 29 are simultaneously formed in semiconductor body 10 adjoining major surface 12 and foundation surface 26, respectively, while narrow base region 30 is formed therebetween. The surfaces of semiconductor body 10 are coated with oxide (not shown) by heating body 10 in an oxygen-rich atmosphere such as steam or air. The oxide coating is then removed, e.g. by masking and etching, from portions of foundation surface 26 and major surface 12 opposite foundation surface 26. Because of the difficulty in masking sidewalls 27, the oxide coating may also be removed from those surfaces.

A N-type impurity (i.e. phosphorus, antimony or arsenic) is then diffused into the exposed surfaces by heating body 10 in an inert atmosphere containing an impurity producing compound such as phosphine gas. The diffusion time is controlled to determine the concentration and penetration of the impurity. The diffusion is precisely controllable because the geometry of the body 10 permits the formation of shallow (e.g. about 4.5 microns), highly concentrated (e.g. $1 \times 10^{19}$ atoms/cm$^3$) emitter and collector regions 28 and 29 while forming a narrow base region 30 (e.g. about 1 micron) and PN junctions 31 and 32 therebetwewen. Where sidewalls 27 have been exposed, collector region 29 may extend in the peripheral portion 25 at the transition with internal portion 24. In any event, the remainder of the oxide coating is removed (e.g. by etching) after diffusion to expose all surfaces of semiconductor body 10.

It should also be noted that the surface area of foundation surface 26 adjoining collector region 29 circumscribes the oppositely facing surface area of major surface 12 adjoining emitter region 28. The surface area adjoining collector region 29 is preferably circumscribed by at least 3 diffusion lengths (i.e. three times the width of base region 30) to substantially reduce power losses into the peripheral portion 25.

An alternative procedure is to mask for the diffusion of emitter and collector region 28 and 29 before the membranous internal portion 24 is formed by deep etching. To effect this, the wafer or body 10 is coated with an oxide by heating body 10 in an oxygen-rich atmosphere before layers 16 and 17 are formed on surface 11. The above-described procedure is thereafter followed in vapo depositing layers 16 and 17, providing photomask layer 18, forming windows 19, 20, 21, and electroplating layer 22; however, subsequent to, concurrently with (e.g. with the formation of photomask layer 18 and window 19) or before such procedure, the major surface 12 is photomasked and diffusion windows selectively opened in the photomask layer. A diffusion window is also opened in the oxide coating on surface 11 corresponding to windows 19, 20 and 21 to expose internal areas of surface 11. Thereafter, membranous internal portion 24 is formed by the prcedures above described and the collector and emitter regions 28 and 29 diffused into the diffusion windows opened in the oxide coatings on surfaces 11 and 12. Then the various layers are all removed for the further manufacturing steps. This method minimizes the production steps and handling after membranous internal portion 24 is formed and in turn reduces the number of rejections. Otherwise, the procedural steps are the same as above described.

Figure 8:
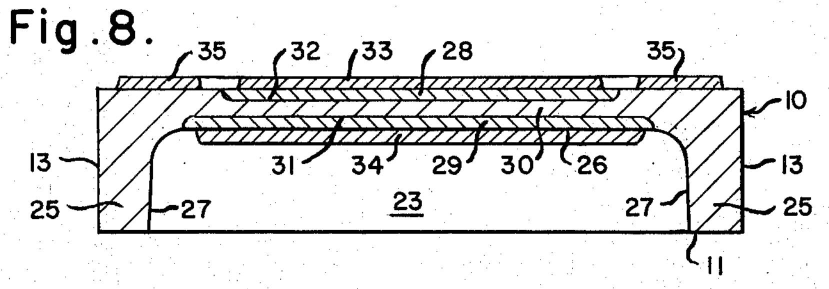

Referring to FIG. 8, metal contacts 33, 34 and 35 are affixed to semiconductor body 10 to make separate ohmic contacts with emitter region 28, collector region 29 and base region 30, respectively. Metal contact 33 is affixed to major surface 12 at internal portion 24 to contour emitter region 28; and metal contact 34 is affixed to contour foundation surface 26 at internal portion 24. Metal contacts 33 may be jointly contour emitter and collector regions 28 and 29, respectively, as closely as possible to optimize the current capacity of the transistor. Metal contact 35 is affixed in an annular shape to major surface 12 at peripheral portion 25. Metal contacts 33, 34 and 35 are preferably formed by evaporating aluminum onto selective portions of the surfaces to a thickness typically of about 30,000 Angstroms by first selectively masking the remaining portions of the surfaces with a material impervious to aluminum.

Figure 9:
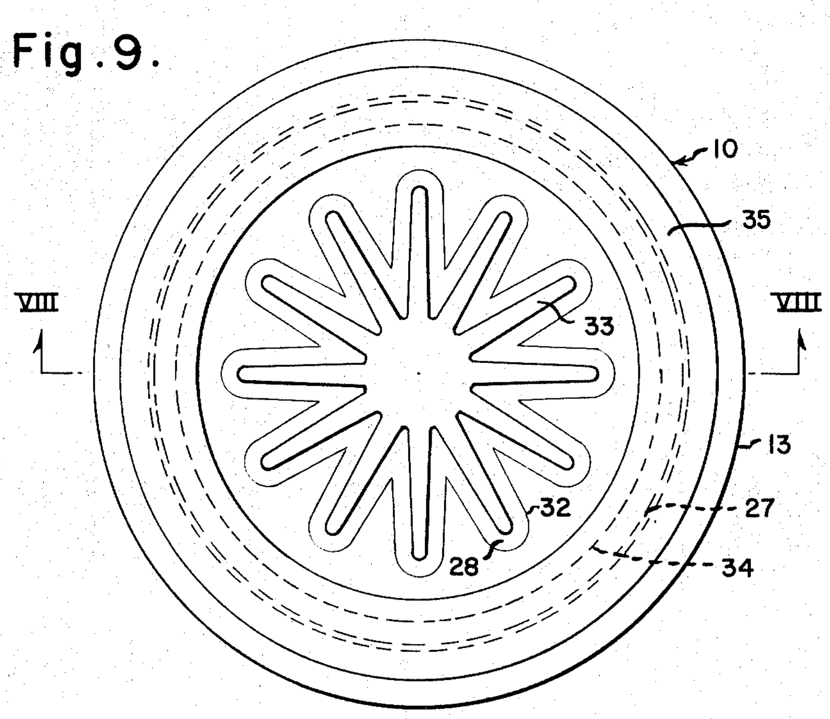
FIG. 9 is a top view of the NPN transistor shown in FIG. 8.

An NPN transistor shown in FIGS. 8 and 9 is thereby formed. Similarly, a PNP transistor can be formed by starting with semiconductor body 10 having a given level of N-type impurity therethrough. P-type impurity (i.e. boron, gallium or aluminum) is simultaneously diffused into major surface 12 and foundation surface 26 to form emitter region 28 and collector region 29, respectively. Alternatively, boron with aluminum and/or gallium may be jointly diffused as the P-type impurity as shown in application Ser. No. 218,097 filed Jan. 17/72 and assigned to the same assignee as the present application. Two component diffusion provides a higher voltage capacity, although some reduction in injection efficiency and in turn current gain also results. In any case, some P-type elements, i.e. gallium and aluminum, have higher diffusion rates than N-type elements so that, although less manufacturing time results, greater care in controlling the diffusion depth is required.

The resulting transistor has its operation in membranous internal portion 24 of body 10 where the performance characteristics of the transistors can be optimized. The impurity level in the starting semiconductor body 10 and the depths of the various regions can be selected to provide a punch-through condition in the internal portion 15 just below the design reverse breakdown voltage. No higher voltage capacity need be provided for safe operating conditions. The resistivity and base width can be minimized and the injection efficiency can be maximized for the given voltage capacity so that maximum current gain and minimum power dissipation result.

Figure 10:
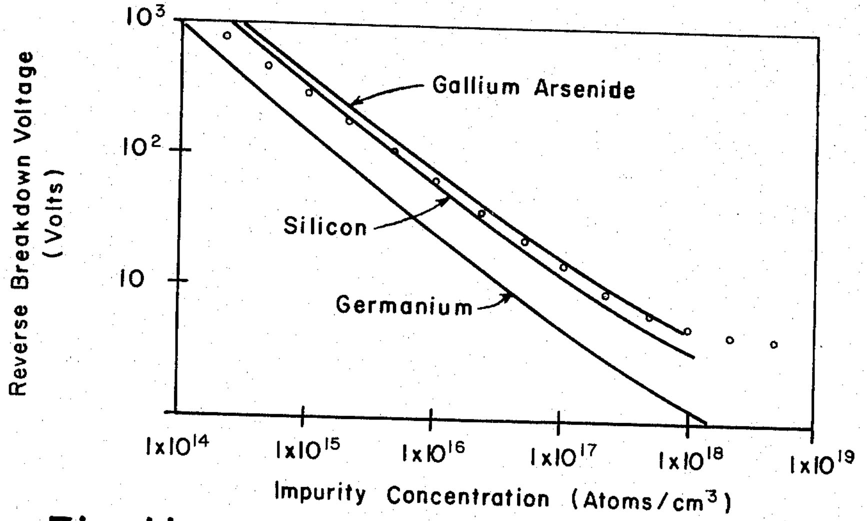
FIG. 10 is a graph showing experimental and calculated plots of reverse breakdown voltage versus impurity concentration for various types of semiconductor materials.
Figure 11:
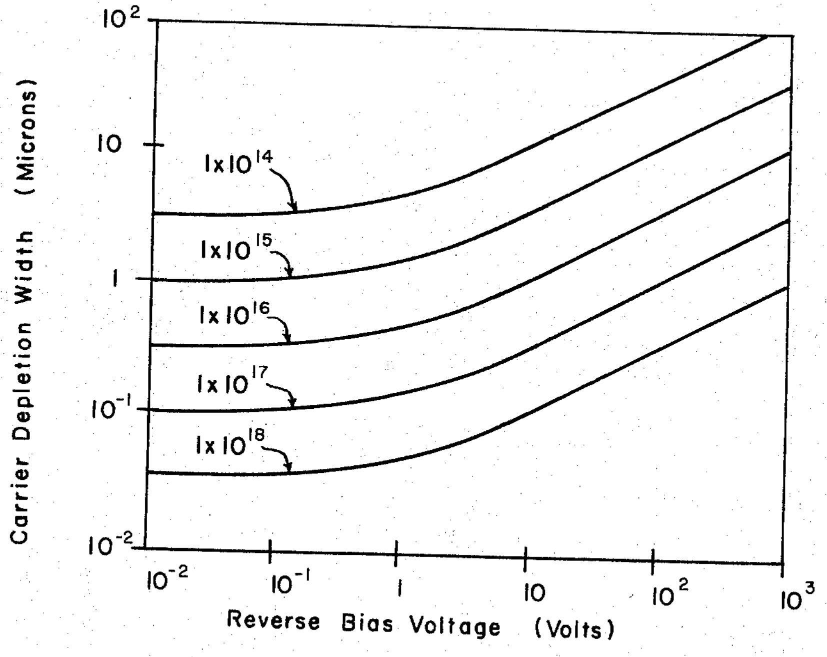
FIG. 11 is a graph showing experimental plots of carrier depletion region widths versus bias voltage.

FIGS. 10 and 11 provide for the design of a transistor of desired electrical characteristics in accordance with the present invention. FIG. 10 shows the change in breakdown voltage with change in impurity concentration for a one-sided step junction for common semiconductor materials, namely germanium, silicon and gallium arsenide. The solid lines are calculated values based on ionization rates. The dotted line is experimentally measured values for silicon. It should be noted that a one-sided step junction assumes that the reverse breakdown voltage is sustained on one side of the junction and that the impurity concentration on the other side of the junction is infinitely large. The one-sided step junction provides a good approximation for the present invention because the impurity concentration in collector region 29 is several orders of magnitude greater than the impurity concentration in base region 30. As shown from FIG. 10, the reverse breakdwon voltage decreases in direct proportion to the increase in impurity concentrations.

FIG. 11 shows the change in width of the carrier depletion region with changes in the reverse bias voltage across a PN junction in silicon at room temperature (i.e. 27°C.) for different impurity concentrations, i.e. from $1 \times 10^{14}$ to $1 \times 10^{18}$ atoms/cm$^3$. The plots are approximations based on a one-sided step junction. As shown, the width of the carrier depletion region increases slowly to a bias voltage of 1 volt and thereafter increases rapidly. The curve shifts downwardly one-half order of magnitude for every increase of one order of magnitude of the impurity concentration.

The NPN transistor of FIGS. 8 and 9 with the desired electrical characteristics can thereby be designed by the selection of the desired current gain ($\beta$), saturation voltage ($V_{CEO}$) and current capacity (I). For example, assume the desired collector-emitter current gain $\beta$ is 60 and the desired collector-emitter saturation voltage (base open) $V_{CEO}$ is 30 volts. The required collector-base avalanche voltage (emitter open) can be calculated [$V_{CBO} = (\beta)^{1/3} V_{CEO}$] to be about 60 volts. From FIG. 10, the required level of impurity concentration of the base region 30 and in turn the impurity level of semiconductor body 10 can be determined (i.e. $1 \times 10^{16}$ atoms/cm$^3$). The impurity concentration established, the required carrier depletion width and in turn the width of the base region 30 on punch-through can be determined from FIG. 11 (i.e. approximately 1 micron). Thus, if the starting semiconductor body 10 is 200 microns in thickness and well 23 is 190 microns in depth, the diffusion depth for the emitter and collector regions 28 and 29 of conjugate concentration profiles is 4.5 microns.

The area of the oppositely facing surfaces of the membranous internal portion 24 is determined for the desired current capacity. The maximum current density is governed by the high level injection condition which gives about $1 \times 10^4$ amps/cm$^2$. However, in practice much lower densities are used. Typically, for silicon, $j$ is about 300 amps/cm$^2$ or less if lower saturation voltage is desired. Thus the area is determined by $A = I/j$. For example, for 75 amperes capacity, the needed area of the opposite surfaces of internal portion 24 is determined to be 0.25 cm$^2$.

The operating current is, however, well below the maximum. Calculated performance data for the transistor for an operating current of 50 amperes and varying effective diameter, i.e. the diameter of transistor operation at the internal region 24, is as follows:

| Operating Current (Amps) | Effective Diameter (CM) | Current Density (Amps/CM²) | $V_{CE}$ (SAT) (mV) | Cut-Off Frequency (MHz) |
|---|---|---|---|---|
| 50 | 0.25 | 1000 | 50 | 10 to 100 |
| 50 | 0.80 | 100 | 5 | 10 to 100 |
| 50 | 1.20 | 50 | 2.5 | 10 to 100 |

While the presently preferred embodiments of the invention and methods for making them have been specifically described, it is distinctly understood that the invention may be otherwise variously embodied and used within the scope of the following claims.

What is claimed is:

1. A transistor comprising: a semiconductor body having a membranous internal portion of substantially uniform thickness of less than about 60 microns and of oppositely facing surfaces each of greater than about 0.10 cm$^2$ in area, and an integral peripheral portion having a thickness of greater than about 150 microns; collector and emitter regions at least partially in the internal portion, each having an impurity concentration of the same conductive type and adjoining one of the oppositely facing surfaces of the internal portion; a base region of an impurity concentration of the conductive type opposite to the conductive type of the impurity of the collector and emitter regions, and of a width less than about 52 microns in the internal portion between the collector and emitter regions; and metal contacts affixed to the oppositely facing surfaces of the internal portion to make separate ohmic contacts with the collector and emitter regions, and affixed to the peripheral portion to make ohmic contact with the base region.

2. A transistor as set forth in claim 1 wherein: the thickness of the internal portion is less than about 20 microns and the thickness of the base region is less than about 12 microns.

3. A transistor as set forth in claim 1 wherein: metal contacts to the collector and emitter regions substantially contour portions of the major surfaces adjoining said regions in the internal portions.

4. A transistor as set forth in claim 3 wherein: the collector and emitter regions are confined to the internal portion of the body.

5. A transistor as set forth in claim 1 wherein: the portion of the surface adjoining the collector region circumscribes by at least about 3 diffusion lengths the oppositely facing portion of the surface adjoining the emitter region.

6. A semiconductor body comprising: a membranous internal portion of substantially uniform thickness of less than about 60 microns and oppositely facing surfaces each of greater than about 0.10 $cm^2$ in area; and an integral peripheral portion of thickness of greater than about 150 microns.

7. A semiconductor body as set forth in claim 6 wherein: the thickness of the internal portion is less than about 20 microns.

* * * * *